(12) United States Patent
Tsujimura et al.

(10) Patent No.: US 7,227,304 B2
(45) Date of Patent: Jun. 5, 2007

(54) IMAGE DISPLAY APPARATUS

(75) Inventors: Takatoshi Tsujimura, Kanagawa (JP);
Koichi Miwa, Kanagawa (JP);
Mototsugu Oohata, Shiga (JP)

(73) Assignees: Kyocera Corporation, Kyoto (JP);
Chi-Mei Optoelectronics Corp. (TW)

( * ) Notice: Subject to any disclaimer, the term of this patent is extended or adjusted under 35 U.S.C. 154(b) by 166 days.

(21) Appl. No.: 10/769,872

(22) Filed: Feb. 3, 2004

(65) Prior Publication Data
US 2004/0206987 A1 Oct. 21, 2004

(30) Foreign Application Priority Data
Feb. 4, 2003 (JP) ............................. 2003-027265

(51) Int. Cl.
*H01J 1/62* (2006.01)
*H01J 63/04* (2006.01)
(52) U.S. Cl. ...................... 313/506; 313/498; 313/504; 313/512
(58) Field of Classification Search ................ 313/498, 313/501, 504, 506, 512; 257/40; 315/169.3
See application file for complete search history.

(56) References Cited
U.S. PATENT DOCUMENTS 5,684,365 A   11/1997 Tung et al. .............. 315/169.3
5,703,436 A * 12/1997 Forrest et al. .............. 313/506
5,757,139 A *  5/1998 Forrest et al. ........... 315/169.3
6,046,543 A *  4/2000 Bulovic et al. ............. 313/504
2004/0036072 A1* 2/2004 Tsujimura et al. ............ 257/72
2004/0108810 A1* 6/2004 Tsujimura et al. .......... 313/506

FOREIGN PATENT DOCUMENTS

JP   8-234683 A   9/1996

\* cited by examiner

*Primary Examiner*—Sikha Roy
*Assistant Examiner*—Kevin Quarterman
(74) *Attorney, Agent, or Firm*—Birch, Stewart, Kolasch & Birch, LLP

(57) ABSTRACT

A transparent substrate is provided thereon with a first thin film transistor and a second thin film transistor to configure a driver circuit; a conductive layer to be connected to a data line or a scan line; a conductive layer to connect the first thin film transistor with the second thin film transistor; and an anode wire layer connected to the second thin film transistor. The anode wire layer is provided thereon with a light emitting diode including a plurality of light emitting layers and electron-hole pair generating layers alternately interposed between the light emitting layers.

13 Claims, 9 Drawing Sheets

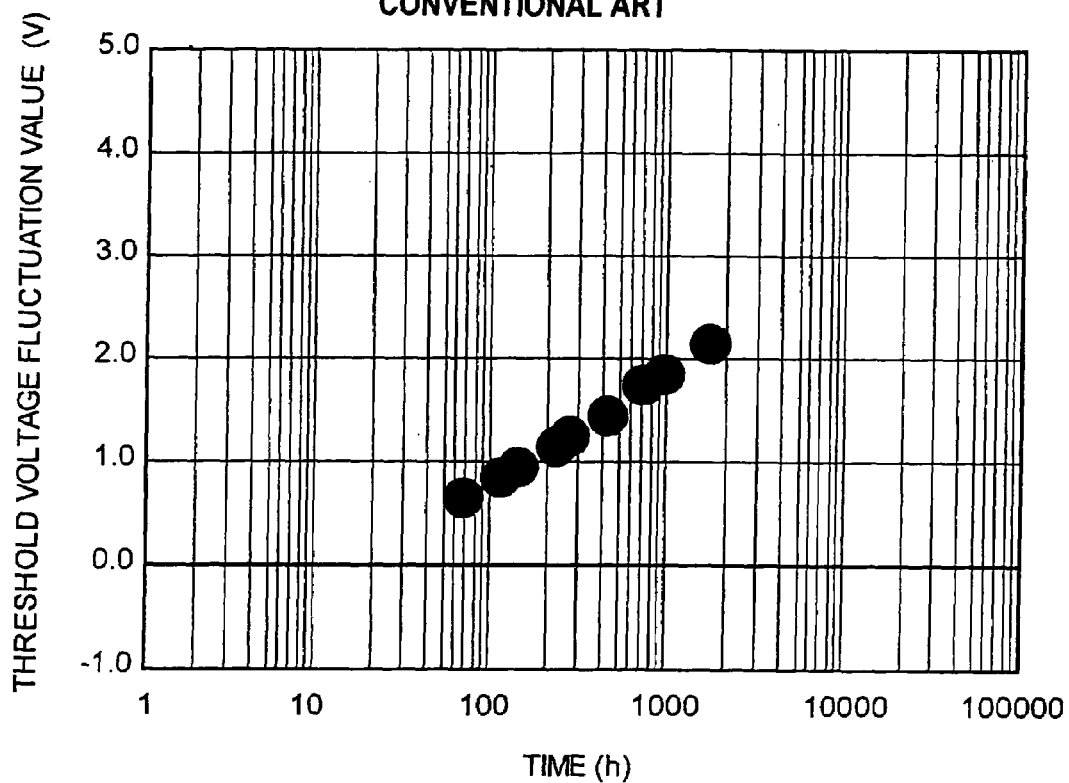

IMAGE DISPLAY APPARATUS

BACKGROUND OF THE INVENTION

1. Field of the Invention

The present invention relates to an image display apparatus that includes spontaneous light-emitting diodes. More particularly, the present invention relates to an image display apparatus of an active-matrix type including driver elements having a current passage region made of amorphous silicon.

2. Description of the Related Art

Currently, image display apparatuses made with organic light emitting diodes (hereinafter, "organic LEDs") are attracting attention as a replacement for the liquid crystal display devices. The image display apparatus including organic LEDs requires no back light because it is spontaneously emissive, and has excellent response speed, contrast, and visibility. The image display apparatus including organic LEDs has an advantage in production costs because it has a relatively simple structure.

FIG. 8 is an equivalent circuit diagram illustrating a structure of a conventional image display apparatus of the active-matrix type including organic LEDs. As illustrated in FIG. 8, the conventional image display apparatus includes an organic LED 101, and a power line 107 connected to a cathode of the organic LED 101 to supply a current to the organic LED 101 under the control of a power line driver circuit 110. The organic LED 101 is connected to a thin film transistor 102, serving as a driver element, that controls the current flowing in the organic LED 101. The thin film transistor 102 is controlled for drive state when a certain gate potential is given from a data line 104 and a scan line 105 via a thin film transistor 103 thereto. This control allows determination of the current flowing in the organic LED 101. The organic LED 101 emits a light of specific intensity in response to the current flowing therein for image display (see for example, Japanese Patent Application Laid-Open No. H8-234683).

The thin film transistor 102 has a drive state-based mobility and accordingly has a function of controlling the current flowing in the organic LED 101 based on the gate potential applied. The proposed structure of the thin film transistor 102 includes a channel layer composed of either polysilicon or amorphous silicon.

The thin film transistor including the channel layer composed of polysilicon can achieve an increased mobility but has a problem that the particle diameter of polysilicon forming the channel layer can not be controlled. The mobility in the thin film transistor of polysilicon suffers the influence of the particle diameter of the polysilicon forming the channel layer. Therefore, the thin film transistor 102 may differ in mobility per pixel if the particle diameter is hardly controlled. For example, a monochromic display over the whole screen requires an equal gate voltage to be applied to the thin film transistors 102 configuring respective pixels. In this case, the thin film transistor of polysilicon is hardly controlled for the particle diameter and thus differs in mobility per pixel, resulting in differences in current flowing in the organic LED 101. Because the organic LED 101 is a current-driven light emitting diode, brightness per pixel fluctuates depending on the current flowing therein, and it is almost impossible to achieve the monochromic display.

To the contrary, the thin film transistor including the channel layer composed of amorphous silicon requires no control for particle diameter. Therefore, an individual thin film transistor arranged per pixel has no problem on difference in mobility. Accordingly, the thin film transistor 102 employed as the driver element for the organic LED is preferable to include the channel layer composed of amorphous silicon. The use of the thin film transistor thus structured allows almost uniform current to flow in the organic LED individually.

The use of the thin film transistor including the channel layer composed of amorphous silicon as the driver element, however, causes a problem because the conventional image display apparatus illustrated in FIG. 8 is difficult to perform image display over a long time. It is known that the threshold voltage varies in the thin film transistor of amorphous silicon when a current flows in the channel layer for a long time. This is because the current flowing in the channel layer varies according to the fluctuation of the threshold voltage even though a constant gate voltage is applied continuously.

FIG. 9 is a graph of variations in fluctuation values of the threshold voltage resulted from continuous flow of a constant current in the channel layer of the thin film transistor including the channel layer of amorphous silicon. In the graph of FIG. 9, the current flowing in the channel layer is controlled in such a manner that a light emitted by a general organic LED is of a brightness of 150 cd/m$^2$.

As is obvious from FIG. 9, fluctuation of almost 1 volt occurs in the threshold voltage after about 100 hours elapsed, and fluctuation of more than 2 volts occurs in the threshold voltage after 2,000 hours elapsed. In general, the image display apparatus including the organic LEDs is required to have a constant brightness for 20,000 hours continuously. Accordingly, it is not desirable that the threshold voltage fluctuates greatly in a short time.

An actual image display apparatus including thin film transistors of amorphous silicon employed as driver elements therefore requires a voltage compensator circuit arranged per pixel in addition to the structure illustrated in FIG. 8. In a specified structure to achieve stable image display, the voltage compensator circuit applies a potential to compensate the threshold voltage for fluctuation components to the gate electrode of the thin film transistor 102 in addition to the potential supplied from the data line 104. Such voltage compensator circuit includes three or four thin film transistors per pixel and additionally requires a place to arrange the voltage compensator circuit on the substrate together with the organic LEDs. Therefore, a new problem arises because the organic LEDs can not be arranged at a high density and a high-resolution image is hardly displayed.

The thin film transistor of amorphous silicon has a problem that it has a low mobility originally. When a conventional organic LED is employed as a light emitting diode, it requires a certain amount of current to achieve a sufficient brightness. Accordingly, an expanded channel width is required to supply such current in the organic LED, resulting in an increase in an area occupied by the thin film transistor serving as the driver element. As a result, a problem arises because an arrangement density of the organic LEDs is lowered and a high-resolution image is hardly displayed.

SUMMARY OF THE INVENTION

It is an object of the invention to solve at least the above described problems.

An image display apparatus according to the present invention includes a light emitting diode that includes a plurality of light emitting layers and electron-hole pair generating layers alternately interposed between the light emitting layers; a driver element that controls a current flowing in the light emitting diode and has a current passage region composed of amorphous silicon; a switching element that controls the driver element for drive state; a data line that supplies a display signal to the switching element; and a scan line that supplies a scan signal to the switching element.

The other objects, features, and advantages of the present invention are specifically set forth in or will become apparent from the following detailed description of the invention when read in conjunction with the accompanying drawings.

BRIEF DESCRIPTION OF THE DRAWINGS

FIG. 9 is a graph showing fluctuation values of the threshold voltage of thin film transistor including the channel layer of amorphous silicon.

DETAILED DESCRIPTION

Figure 1:
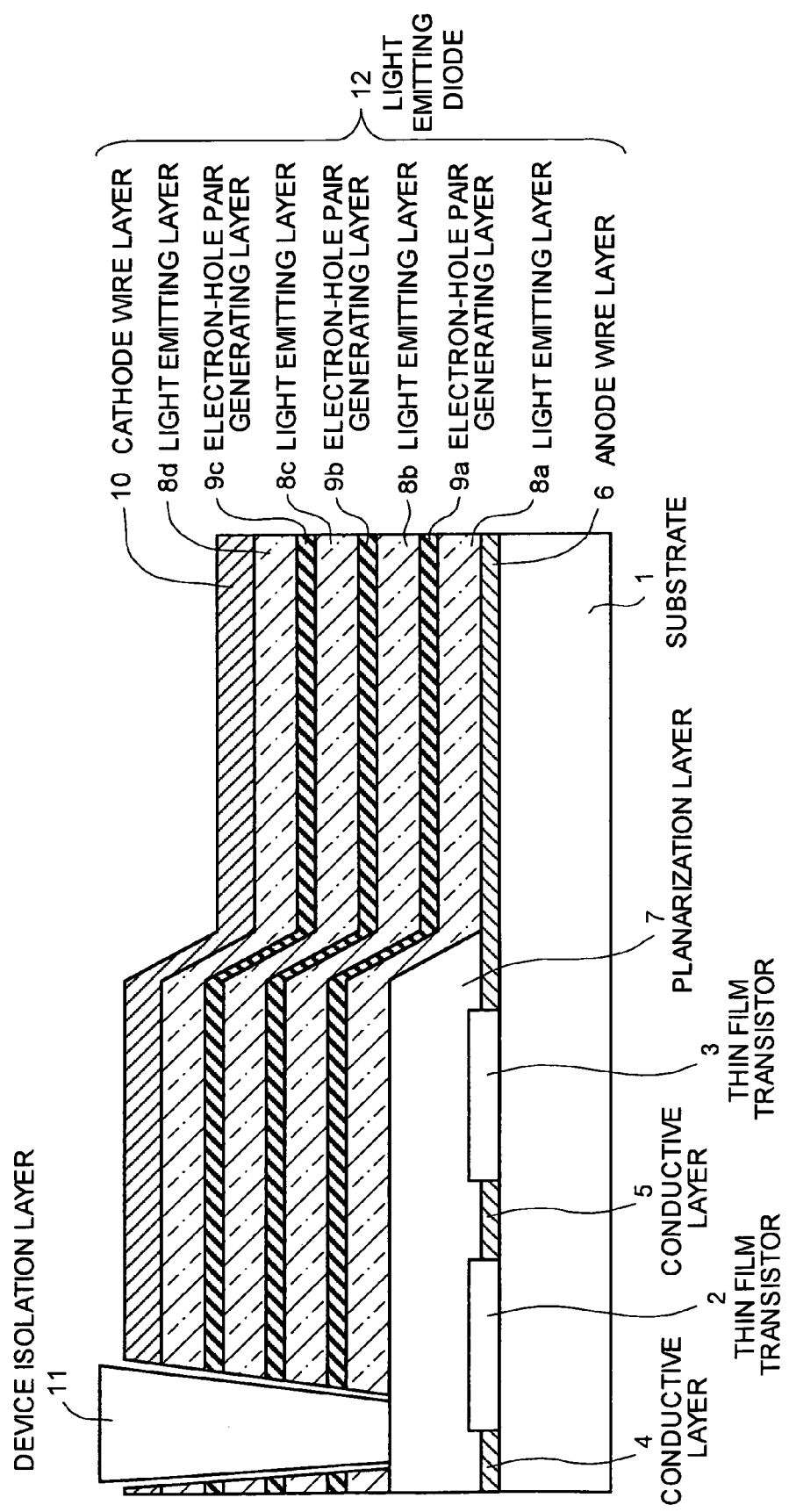
FIG. 1 is a cross-sectional view of an image display apparatus according to a first embodiment.

Exemplary embodiments of an image display apparatus according to the present invention is explained with reference to the accompanying drawings. It should be noted that the accompanying drawings are only illustrative and that actual products utilizing the invention may be different from the drawings. Also, parts, of which sizes or ratio between in each drawing are different, may be included in the drawings.

An image display apparatus according to a first embodiment of the present invention is explained first. The image display apparatus according to the first embodiment includes a low-current light emitting diode including a plurality of light emitting layers and, between the light emitting layers, electron-hole pair generating layers alternately interposed for contributing to light emission. It is structured to reduce current flowing in the amorphous silicon-containing driver element on image display to display a stable image for a long time.

FIG. 1 is a cross-sectional view of the image display apparatus according to the first embodiment. As illustrated in FIG. 1, the image display apparatus according to the first embodiment includes, on a transparent substrate 1, a thin film transistor 2 and a thin film transistor 3 to configure a driver circuit, a conductive layer 4 to be connected to a data line or a scan line described later, a conductive layer 5 to connect the thin film transistor 2 with the thin film transistor 3, and an anode wire layer 6 connected to the thin film transistor 3. A planarization layer 7 is disposed over the thin film transistors 2 and 3. A light emitting diode 12 and a device isolation layer 11 for isolating the light emitting diode 12 per display pixel are arranged on the anode wire layer 6 and the planarization layer 7. The thin film transistors 2, 3 and the light emitting diode 12 are arranged in a structure per display pixel for monotone display, and in a structure per sub-pixel corresponding to each of R (red), G (green), and B (blue) in a display pixel for color display. (The display pixel and the sub-pixel are hereinafter collectively referred to as "display pixel and the like").

The thin film transistor 3 controls the current flowing in the light emitting diode 12. The thin film transistor 3 is connected to the light emitting diode 12 via one source/drain electrode and the anode wire layer 6. The thin film transistor 3 is structured to have a channel layer serving as a current passage layer composed of amorphous silicon. Therefore, the thin film transistor 3 has a stable characteristic, that is, there are no fluctuations in a voltage-current characteristic per display pixel and the like due to differences in physical structure of the channel layer.

The thin film transistor 2 is employed to control the thin film transistor 3 for drive state and serves as a switching element. The thin film transistor 2 has a channel layer, which may be composed of either amorphous silicon or polysilicon.

The planarization layer 7 is employed to planarize the upper surfaces in the regions of the thin film transistors 2 and 3 arranged. Though simply illustrated in FIG. 1, actual thin film transistors 2 and 3 have complicated multi-layered structures composed of various different materials. Accordingly, the thin film transistors 2 and 3 have the upper surfaces complicatedly roughed. On the other hand, the light emitting diode 12 to be disposed on the upper layer is formed of a very thin material layer and hardly stacked over the rough surfaces. Therefore, the image display apparatus according to the first embodiment is structured to dispose the planarization layer 7 over the regions of the thin film transistors 2 and 3 arranged and stack the light emitting diode 12 on the planarization layer 7. The planarization layer 7 is generally formed to include an organic material such as photoresist, but materials other than organic materials may be employed if they can planarize the upper layers of the thin film transistors 2 and 3.

The device isolation layer 11 is employed to isolate the light emitting diode 12 per display pixel and the like to prevent occurrences of crosstalk between a light emitting diode located for a display pixel and the like and light emitting diodes located for other display pixels and the like. Specifically, the device isolation layer 11 is formed of a photosensitive polymeric film as material by photolithography using a photo-mask corresponding to the shape of the device isolation layer 11. From the viewpoint of device isolation, it is preferable to have a reverse-tapered trapezoid in section with the upper bottom larger than the lower bottom though other shapes in section may also be applied.

The light emitting diode 12 is explained next. The light emitting diode 12 is a spontaneous light-emitting diode that emits a light with a brightness corresponding to an injected current and directly contributes to image display in the image display apparatus according to the first embodiment. Specifically, it has a stacked structure that includes light emitting layers 8a to 8d, which emit light on recombination of electrons with holes, and electron-hole pair generating layers 9a to 9c, which are alternately interposed between the light emitting layers 8a to 8d. It includes an anode wire layer 6 disposed on the bottom to be connected to an external circuit element, and a cathode wire layer 10 disposed on the top. FIG. 1 exemplifies a structure that includes four light emitting layers 8 and three electron-hole pair generating layers 9. It should be noted that the numbers of the light emitting layers 8 and the electron-hole pair generating layers 9 are not limited to those illustrated in FIG. 1.

The anode wire layer 6 not only serves as an anode electrode of the light emitting diode 12 but also electrically connects the light emitting diode 12 to the thin film transistor 3. In the first embodiment, the anode wire layer 6 is composed of aluminum (Al), copper (Cu) or the like and has a structure that can transmit the light emitted from the light emitting layers 8a to 8d. For example, the anode wire layer 6 may have a thinned structure that can transmit light therethrough. Alternatively, it may have a structure with partly-arranged bores serving as transparent apertures.

The cathode wire layer 10 serves as a cathode electrode of the light emitting diode 12. Specifically, the cathode wire layer 10 is composed of a conductive material, for example, a metal such as Al and Cu. The image display apparatus according to the first embodiment has such a structure that allows the light emitted from the light emitting diode 12 to pass through the substrate 1 to external. Accordingly, the cathode wire layer 10 is allowed to have a larger film thickness because it is not required to have optical transparency.

The light emitting layers 8a to 8d are composed of materials corresponding to respective certain wavelengths, preferably organic materials. They are structured to emit light on recombination of electrons injected from the cathode and holes injected from the anode. Specifically, the light emitting layers 8a to 8d are composed of an organic material such as phthalocyanine, tris-aluminum complex, benzoquinolinolato, and beryllium complex and structured to include a certain additional impurity, if required.

The electron-hole pair generating layers 9a to 9c generate holes to the cathode (upward in FIG. 1) and electrons to the anode on application of a voltage. The electron-hole pair generating layers 9a to 9c are composed of a conductive material having optical transparency. Specifically, it is preferably composed of a transparent conductive material, for example, a metal oxide such as ITO (Indium Tin Oxide) and IZO (Indium Zinc Oxide). The electron-hole pair generating layers 9a to 9c may be formed of a conductive layer that includes a metallic material such as cesium (Cs) in a lower layer below ITO because ITO has a higher electronegativity. Preferably, such conductive layer includes cesium-containing BPHPEN or BCP. Alternatively, the electron-hole pair generating layers 9a to 9c may be formed of a material such as chromium (Cr), Al, and Cu in a thinned structure that can transmit light therethrough or a structure partly provided with transparent apertures.

Figure 2:
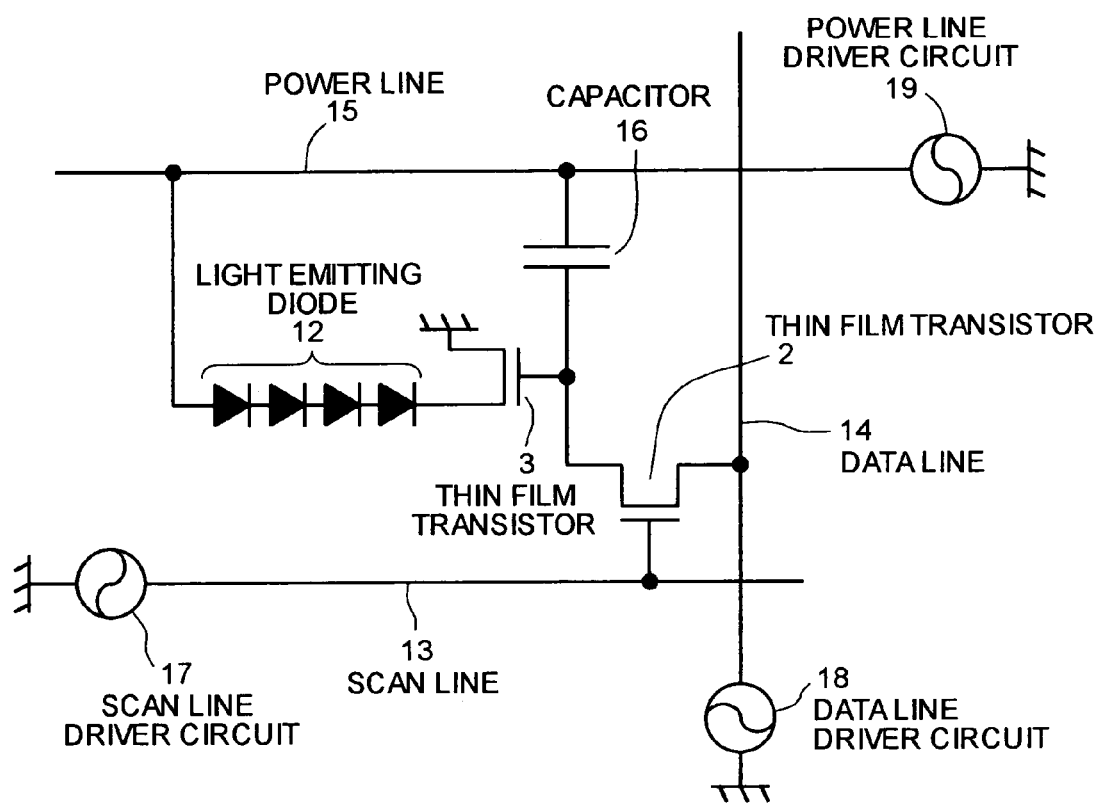
FIG. 2 is an equivalent circuit diagram illustrating wire structure in the image display apparatus according to the first embodiment.

Specific connections among circuit elements in each display pixel and the like in the image display apparatus according to the first embodiment will be explained. FIG. 2 illustrates an equivalent circuit in each display pixel and the like in the image display apparatus according to the first embodiment.

The image display apparatus according to the first embodiment is structured as illustrated in FIG. 2. The anode of the light emitting diode 12 is connected to one of the source/drain electrodes of the thin film transistor 3 serving as the driver element. The gate electrode of the thin film transistor 3 is connected to one of the source/drain electrodes of the thin film transistor 2. The other source/drain electrode of the thin film transistor 2 is connected to a data line 14 and the gate electrode thereof is connected to a scan line 13. The cathode of the light emitting diode 12 is connected to a power line 15. A capacitor 16 is connected in between the power line 15 and the gate electrode of the thin film transistor 3. The power line 15 is provided with a power supply function when it is connected to a power line driver circuit 19. The scan line 13 and the data line 14 are connected to a scan line driver circuit 17 and a data line driver circuit 18, respectively, to supply certain potentials to the gate electrode and the other source/drain electrode of the thin film transistor 2. The light emitting diode 12 has the structure provided with plural light emitting layers as illustrated in FIG. 1. Therefore, it can be electrically regarded as a structure that includes plural serially connected light emitting diodes and is expressed by the structure illustrated in FIG. 2.

A mechanism to supply current in the light emitting diode 12 is explained next with reference to FIG. 2. The scan line driver circuit 17 applies a certain potential via the scan line 13 to the gate electrode of the thin film transistor 2 to turn ON the thin film transistor 2. The data line driver circuit 18 then applies a certain potential via the data line 14 to the thin film transistor 2 already turned ON to write a certain potential to the capacitor 16 via the channel layer in the thin film transistor 2. One of the electrodes of the capacitor 16 is electrically connected to the gate electrode of the thin film transistor 3. Accordingly, the potential retained in the capacitor 16 is applied to the gate electrode of the thin film transistor 3.

Because of the application of the potential, the thin film transistor 3 turns ON so that a certain amount of current flows in the channel layer of the thin film transistor 3. Because the light emitting diode 12 is connected to one of source/drain electrodes of the thin film transistor 3, a current defined by the mobility in the channel layer of the thin film transistor 3 flows in the light emitting diode 12. As a result, the light emitting diode 12 emits a light with a brightness corresponding to the current. The thin film transistor 2 turns OFF once the potential is written in the capacitor 16 while the capacitor 16 holds the potential written therein. Therefore, the gate potential on the thin film transistor 3 can be retained. Thus, the current corresponding to the gate potential continuously flows in the channel layer of the thin film transistor 3 and the light emitting diode 12 to keep the light emitting diode 12 in light emitting state.

Therefore, on image display, the current continuously flowing in the channel layer of the thin film transistor 3 serving as the driver element may possibly cause fluctuations of the threshold voltage due to a long-term current flow. A range of such fluctuations of the threshold voltage corresponds to an amount of charged particles that pass through the channel layer. Accordingly, in the image display apparatus according to the first embodiment, the current flowing in the light emitting diode 12 is lowered to reduce the fluctuations of the threshold voltage of the thin film transistor 3 or the driver element.

Figure 3:
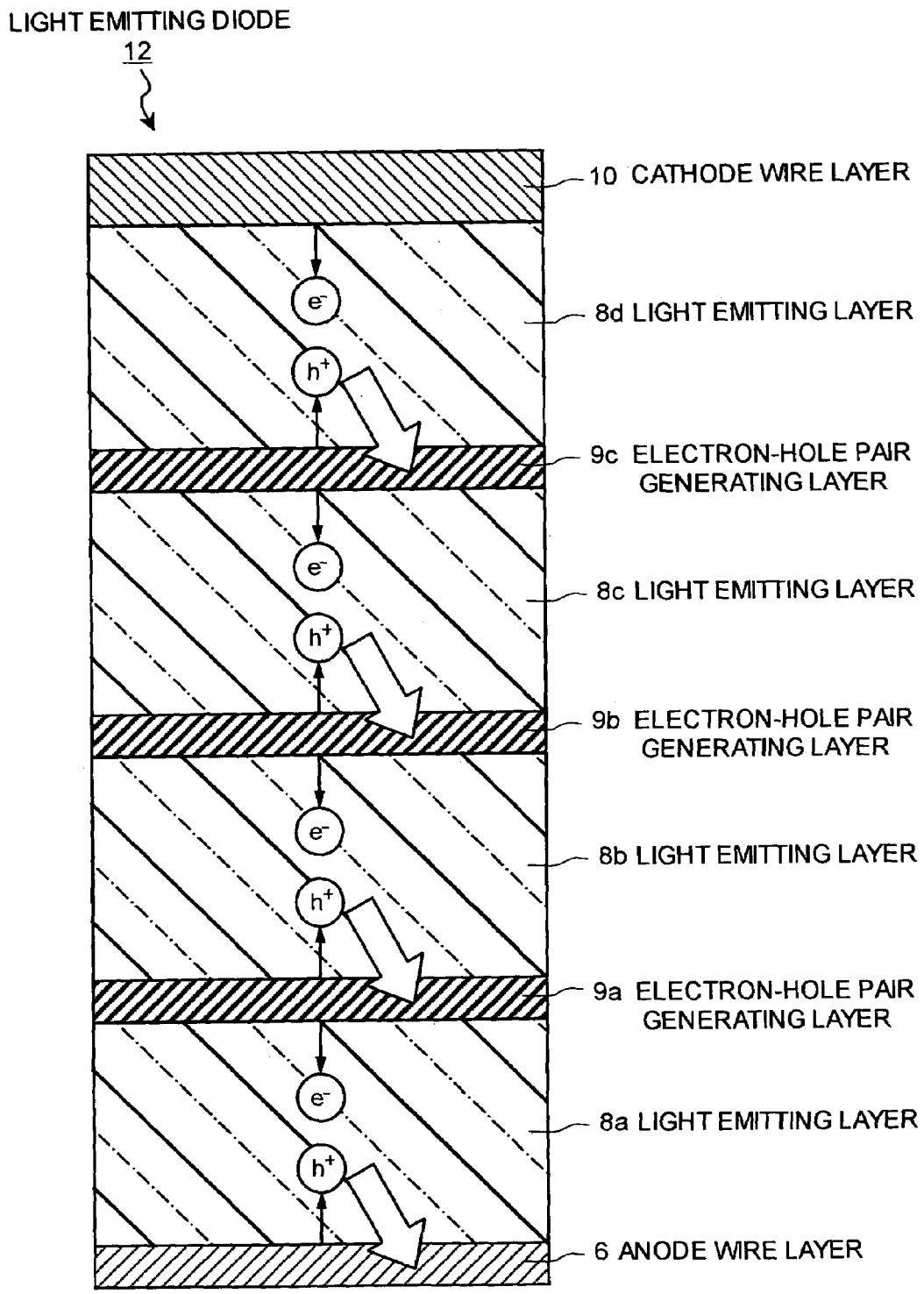
FIG. 3 is a schematic view for explaining a mechanism of light emission from the light emitting diode constituting the image display apparatus of the first embodiment.

FIG. 3 is a schematic of a mechanism of light emission from the light emitting diode 12. The organic material contained in the light emitting layers 8a to 8d gets excited because of the recombination of electrons supplied from outside and the holes, and then the molecules transiting from the pumped state to the basis state yield extra energy, which is converted into light. The electron-hole pair generating layers 9a to 9c contained in the light emitting diode 12 have a function of supplying electrons to the anode wire layer 6 and holes to the cathode wire layer 10 when respective certain potentials are applied thereto. In the image display apparatus according to the first embodiment, the electron-hole pair generating layers 9a to 9c are provided to emit a light with a sufficient brightness at a lower current.

A light emission mechanism in the light emitting layer 8c is exemplified. In the light emitting layer 8c, holes generated from the electron-hole pair generating layer 9b and electrons generated from the electron-hole pair generating layer 9c are injected from external and recombined in the light emitting layer 8c to emit light. In this case, both holes and electrons injected into the light emitting layer 8c are not supplied from outside the light emitting diode 12 but generated inside the light emitting diode 12. Therefore, charged particles that contribute to light emission in the light emitting layer 8c are not directly related to charged particles that pass through the channel layer in the thin film transistor 3. Thus, the light emission in the light emitting layer 8c exerts no influence on the channel layer in the thin film transistor 3. Similarly, holes and electrons injected into the light emitting layer 8b, electrons injected into the light emitting layer 8a, and holes injected into the light emitting layer 8d are generated inside the light emitting diode 12 and converted into light inside the light emitting layer. Therefore, these charged particles exert no influence on deterioration of the channel layer in the thin film transistor 3. Thus, the light emitting diode 12 can emit a light at a higher efficiency than conventional diodes when the same current is fed therein via the thin film transistor 3. This is effective to reduce the current flowing in the thin film transistor 3 to emit a light with the same brightness.

Figure 4:
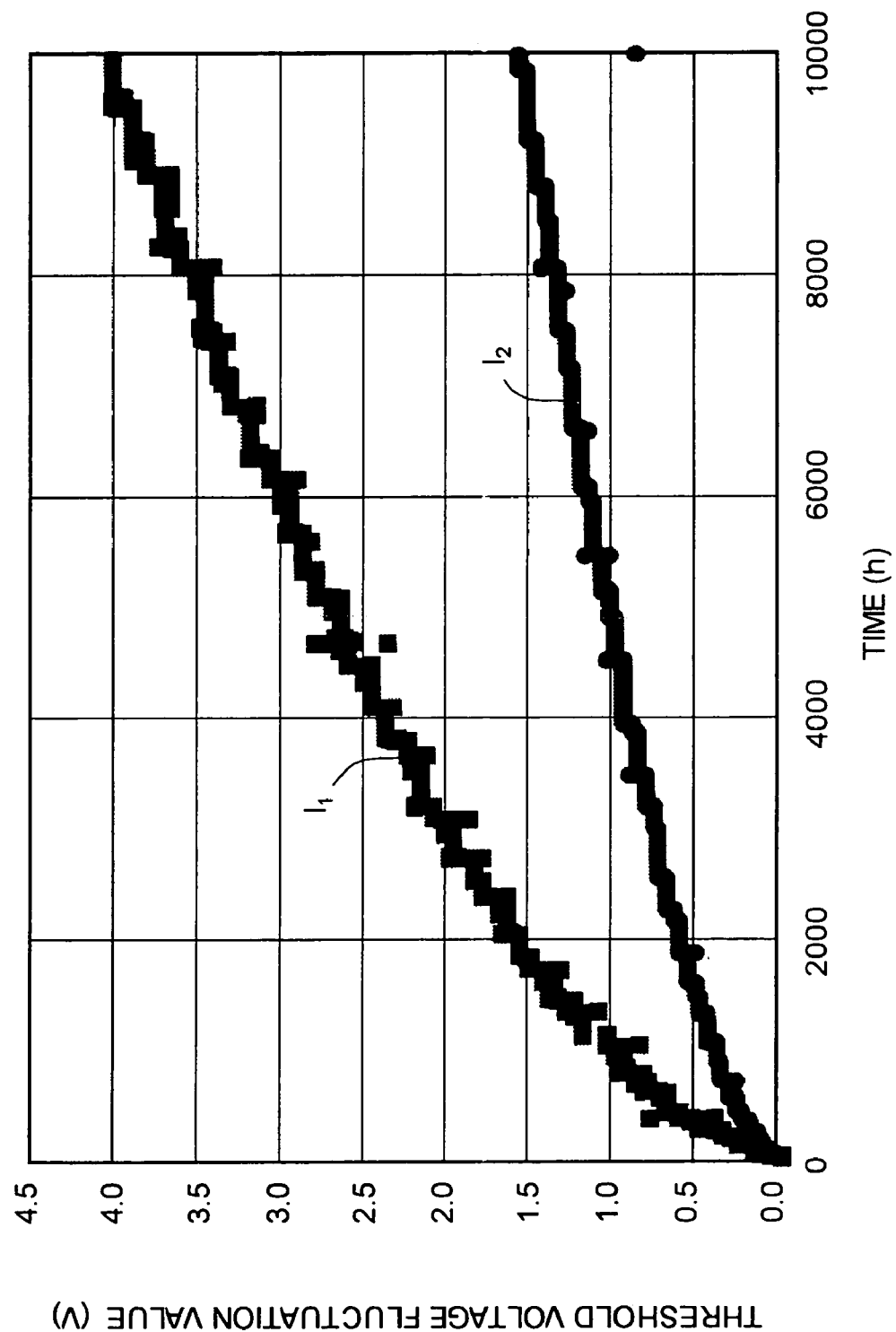
FIG. 4 is a graph showing a relation between a threshold voltage and a current flowing in a channel layer, with respect to a thin film transistor including a channel layer of amorphous silicon.

An electrical characteristic of the driver element that never fluctuates over long-term image display in the first embodiment, specifically a relation between a current flowing in the channel layer of the thin film transistor 3 serving as the driver element and a fluctuation value of the threshold voltage will be explained. FIG. 4 is a graph showing results measured in an acceleration test applied to similarly structured thin film transistors having a channel layer composed of amorphous silicon for time-fluctuations in fluctuation values of the threshold voltage when a current is allowed to flow continuously in the channel layer. In FIG. 4, the curve $I_1$ shows the threshold voltage fluctuation obtained by flow of a current of $1 \times 10^{-6}$ amperes required to drive the conventional organic LED for light emission with a sufficient brightness. The curve $I_2$ shows that obtained by flow of a half current of $0.5 \times 10^{-6}$ amperes.

As is obvious from comparison of the curve $I_1$ with the curve $I_2$, the threshold voltage at the time when 4,000 hours elapsed is equal to 2.5 volts on the curve $I_1$ and 1 volt or below on the curve $I_2$ to the contrary. Thus, the half current can reduce the fluctuation value of the threshold voltage down to about $2/5$. In comparison of time required to reach a certain fluctuation value of the threshold voltage, the difference depending on the current is remarkable. For example, if an allowable fluctuation value of the threshold voltage for the driver element is equal to 1 volt, the curve $I_1$ exceeds the allowable value in about 1,000 hours while the curve $I_2$ reaches the allowable value first after 4,000 hours or more elapsed. If the allowable value is equal to 1.5 volts, the curve $I_1$ exceeds the allowable value in 2,000 hours or below while the curve $I_2$ requires about 10,000 hours. Therefore, if the current flowing in the channel layer is halved, the lifetime of the driver element is not simply doubled but rather can be increased by 4 to 5 times or more. The light emitting diode 12 for use in the first embodiment includes four light emitting layers. Accordingly, the current required to emit a light with the same brightness is theoretically sufficient if it is almost equal to a quarter of a conventional value. Thus, the lifetime of the thin film transistor 3 serving as the driver element can be further elongated. The image display apparatus according to the first embodiment is almost possible to solve the problem associated with the deterioration of the image quality that is caused by the fluctuation of the electrical characteristic of the driver element. As a result, stable image display can be performed over a long time.

Generation of electrons and holes from the electron-hole pair generating layers 9a to 9c requires application of respective certain potentials to the electron-hole pair generating layers 9a to 9c, resulting in an increase in the voltage applied to the whole light emitting diode 12. The fluctuation of the electrical characteristic of the thin film transistor 3 is mainly caused by the amount of passing charged particles and is not influenced from the voltage applied to the light emitting diode 12. Therefore, it exerts no influence on long-term stable image display. As described above, the image display apparatus according to the first embodiment can emit light with a sufficient brightness at a low current. Accordingly, the increase in the voltage applied to the light emitting diode 12 does not result in any increase in power consumption.

As the electrical characteristic of the thin film transistor 3 or the driver element is stabilized over a long time, the image display apparatus according to the first embodiment requires no additional compensator circuit provided for compensating the threshold voltage of the thin film transistor 3 for fluctuations. Accordingly, the area occupied by the non-emission region on the substrate 1 can be reduced. This is effective to upsize the light emitting diode 12 in an individual display pixel and the like or increase the number of the display pixels and the like. Therefore, the image display apparatus according to the first embodiment can achieve high-brightness or high-precision image display.

Figure 5:
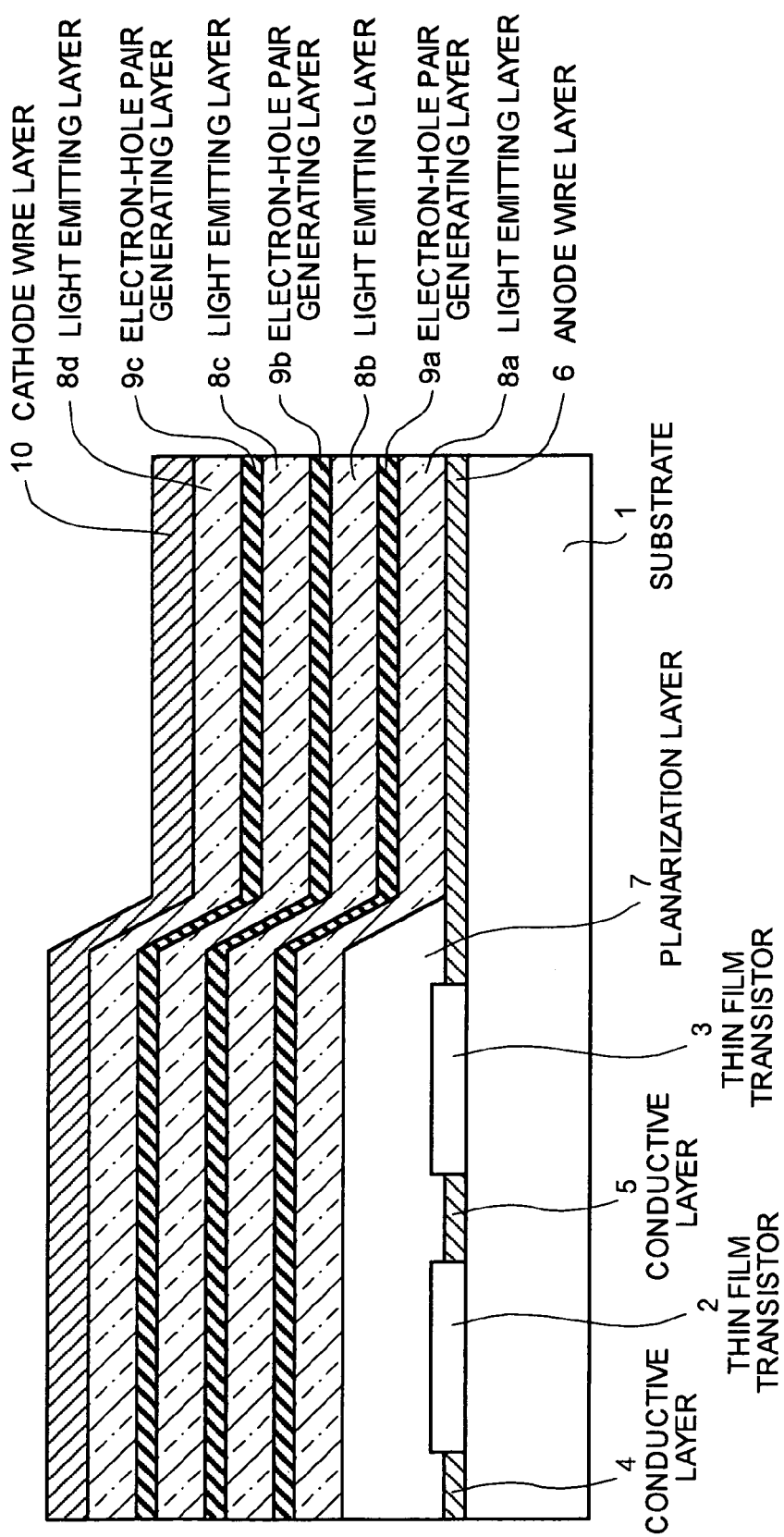
FIG. 5 is a cross-sectional view illustrating a modification of the image display apparatus according to the first embodiment.

The structure including the light emitting diode 12 provided with the light emitting layers 8a to 8d and the electron-hole pair generating layers 9a to 9c does not arise a problem associated with an increase in production costs. This is because the light emitting layers 8a to 8d may be composed of known organic materials and the like and the electron-hole pair generating layers 9a to 9c may also be composed of existing materials such as ITO in the first embodiment. In the first embodiment, the device isolation layer 11 is formed in each display pixel and the like to isolate the light emitting diode 12 from others. Alternatively, the device isolation layer can be omitted in such a structure as illustrated in FIG. 5. The organic materials and the like for use in the light emitting layers originally have lower electric conductivity. Selection of appropriate materials can achieve such a structure that allows charged particles to move only vertically based on the voltage applied across the anode wire layer 6 and the cathode wire layer 10. Accordingly, even if the light emitting layers or the electron-hole pair generating layers are formed continuously over adjacent display pixels and the like, it is possible to suppress an occurrence of crosstalk that is caused when a current flows laterally. Such structure can omit the process steps required in formation of the device isolation layer and reduce the production costs.

An image display apparatus according to a second embodiment is explained next. The image display apparatus according to the second embodiment is structured to comprise a light emitting diode that includes a plurality of light emitting layers and electron-hole pair generating layers alternately sandwiched between the light emitting layers. The light emitting layers individually emit lights having wavelengths corresponding to R, G, and B, which are synthesized to output a white light. The "white light" not only indicates a completely colorless light but also includes colors similarly regarded as substantial white conceptually.

A color image can be displayed using a color filter that can transmit the lights having wavelengths corresponding to R, G, and B per sub-pixel. The image display apparatus according to the second embodiment has the same basic structure as that of the image display apparatus according to the first embodiment, and specifically has the structure illustrated in FIGS. 1 and 2. Therefore, the points not particularly mentioned hereinafter can be interpreted as similar to those in the first embodiment.

Figure 6:
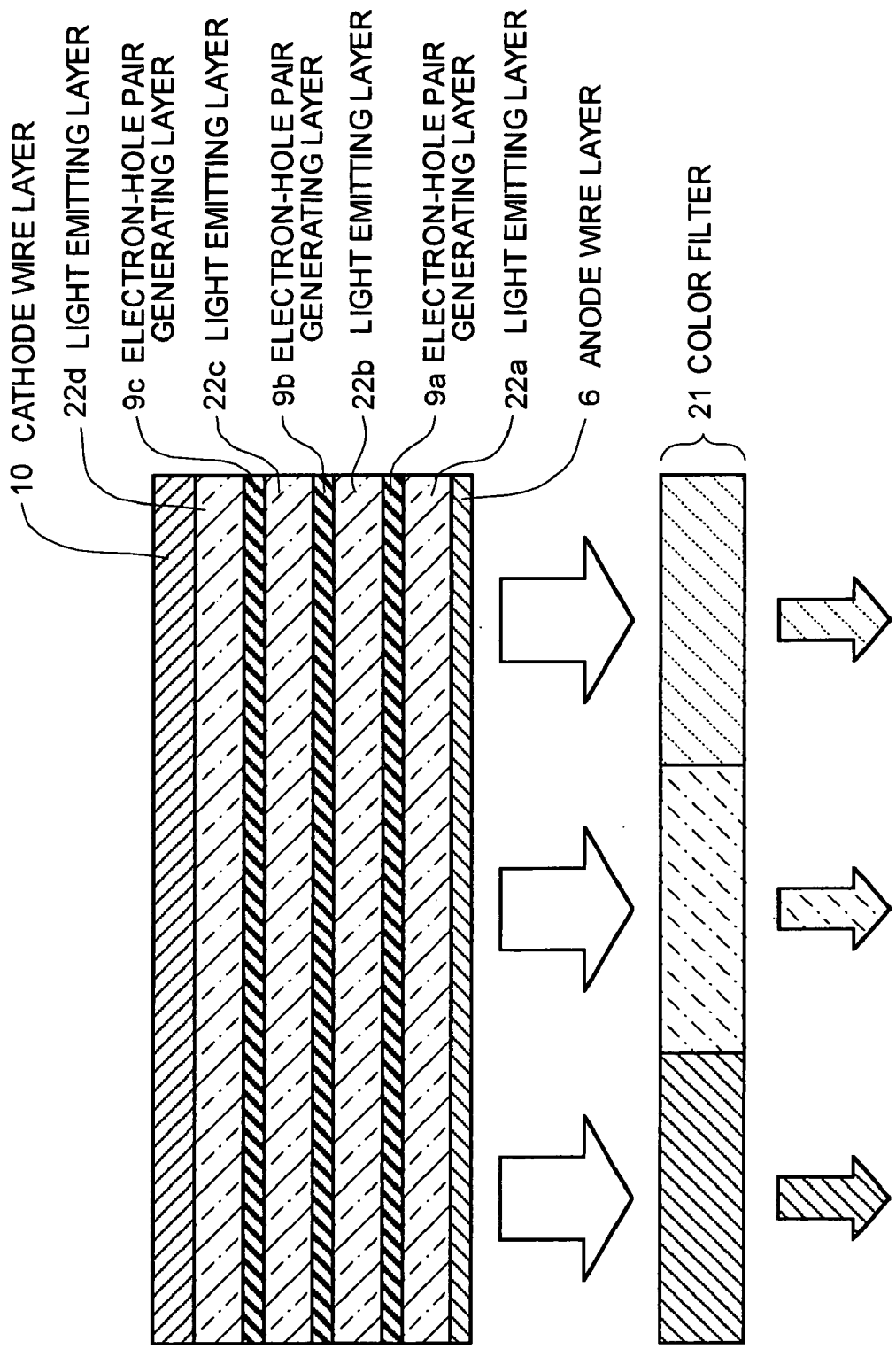
FIG. 6 is a schematic diagram for explaining a color image display mode of an image display apparatus according to a second embodiment.

FIG. 6 is a schematic diagram illustrating a light emitting diode 20 and a color filter 21 in a portion corresponding to a display pixel, among constituents in the image display apparatus according to the second embodiment, and is a diagram for explaining a color image display mode. Specifically, the color filter 21 is located in a lower layer below the substrate 1 illustrated in FIG. 1. It has a function of passing the lights having wavelengths corresponding to R, G, and B therethrough on receipt of the white light emitted from the light emitting diode 20.

The light emitting diode 20 is structured in the same manner as that of the first embodiment, that is, it includes a plurality of light emitting layers 22a to 22c and the electron-hole pair generating layers 9a and 9b alternately interposed between the light emitting layers, which are sandwiched between the anode wire layer 6 and the cathode wire layer 10. The anode wire layer 6, the cathode wire layer 10, and the electron-hole pair generating layers 9a and 9b have the same specific structures and functions as those in the first embodiment.

The light emitting layers 22a to 22c are composed of materials that emit lights having wavelengths corresponding to R, G, and B on recombination of electrons and holes. A structure for emission of lights having respective wavelengths requires Ir(btp)$_2$(acac) corresponding to R, Ir(ppy)$_3$ corresponding to G, and Firpic corresponding to B to be added as impurities to the light emitting layers 22a to 22c, respectively, for example. Such structure enables the light emitting layers 22a to emit the light having the wavelength corresponding to R, and the light emitting layers 22b and 22c to emit the lights having the wavelengths corresponding to G and B, respectively. Thus, the light emitting diode 20 emits the white light as a whole.

The image display apparatus according to the second embodiment has advantages as explained next. First, similar to the first embodiment, it has a structure that includes the electron-hole pair generating layers interposed between the light emitting layers. Therefore, there is an advantage because it can emit a high-brightness light at a low current and requires no compensator circuit even if a thin film transistor having a channel layer of amorphous silicon is employed as a driver element.

There is another advantage in the structure in which the light emitting diode 20 emits the white light and the lights having wavelengths corresponding to R, G, and B are extracted through the color filter 21 because no need for patterning the light emitting diode per sub-pixel can simplify the process steps. In a word, on formation of the light emitting diode 20, the anode wire layer 6, the light emitting layers 22a to 22c and electron-hole pair generating layers 9a and 9b, and the cathode wire layer 10 can be stacked uniformly on the substrate 1. Thus, the light emitting diodes that emit the lights having wavelengths corresponding to R, G, and B can be easily produced without the need for respective different process steps to form them.

The image display apparatus according to the second embodiment can emit an almost pure white light with lowered saturation, for example, as the light emitting diode 20 is structured to include a plurality of light emitting layers. Conventional light emitting layers hardly emit light components of R, G, and B with uniform intensity because of differences in emission efficiency associated with the impurities corresponding to R, G, and B. The image display apparatus according to the second embodiment can include a plurality of stacked light emitting layers to the contrary. Accordingly, the structure of the light emitting diode 20 including a plurality of stacked light emitting layers corresponding to colors with lower emission efficiencies can emit a light having light components of R, G, and B with unified intensity and saturation whitened to the extent that causes no problems substantially.

Instead of the structure in which the light emitting layers 22a to 22c emit lights with wavelengths corresponding to R, G, and B respectively, the image display apparatus according to the second embodiment may have a structure in which all the light emitting layers 22a to 22c emit white lights by addition of the above impurities to all the light emitting layers 22a to 22c, for example.

Figure 7:
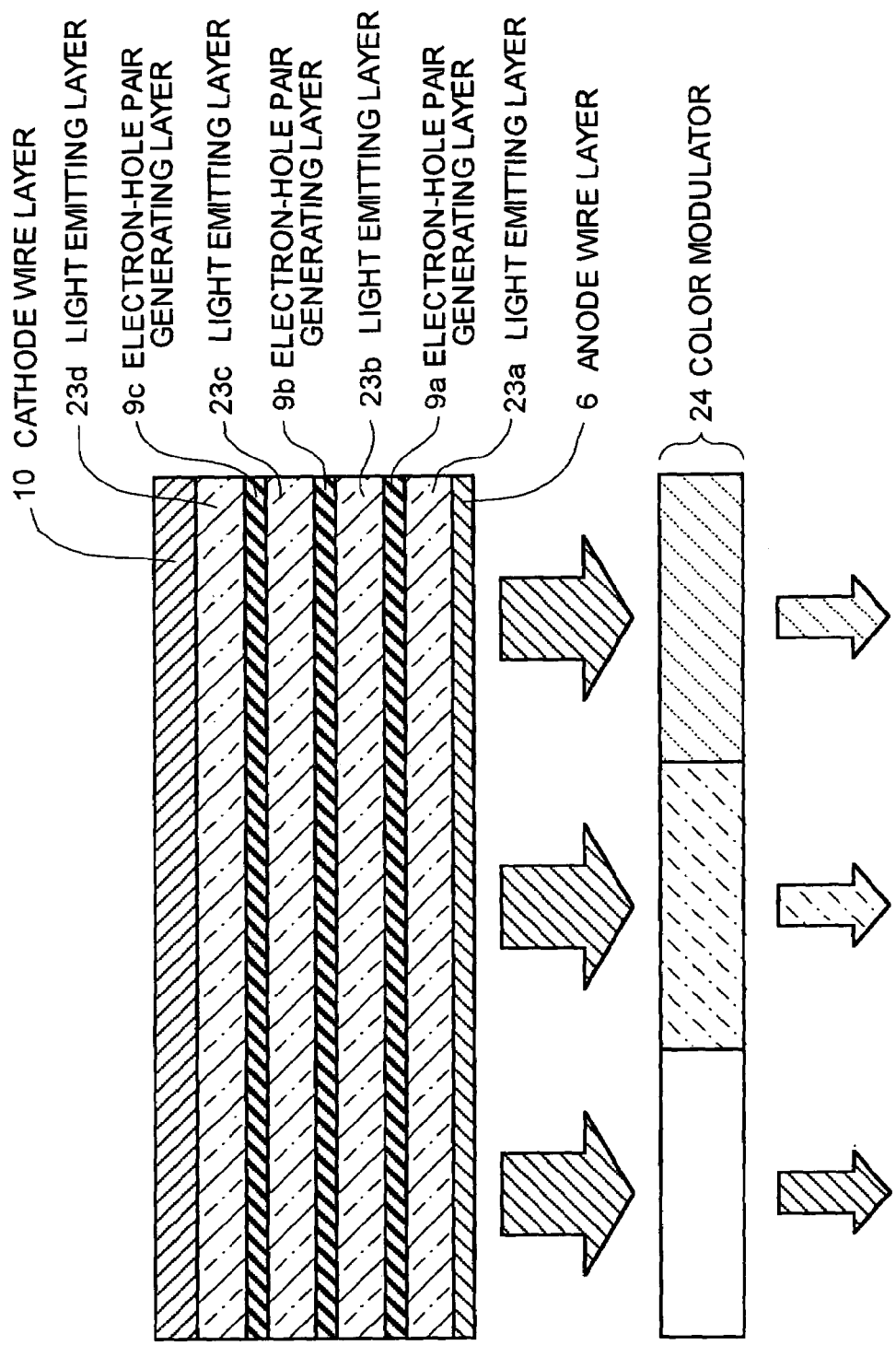
FIG. 7 is a schematic diagram for explaining a color image display mode of an image display apparatus according to a modification of the second embodiment.
Figure 8:
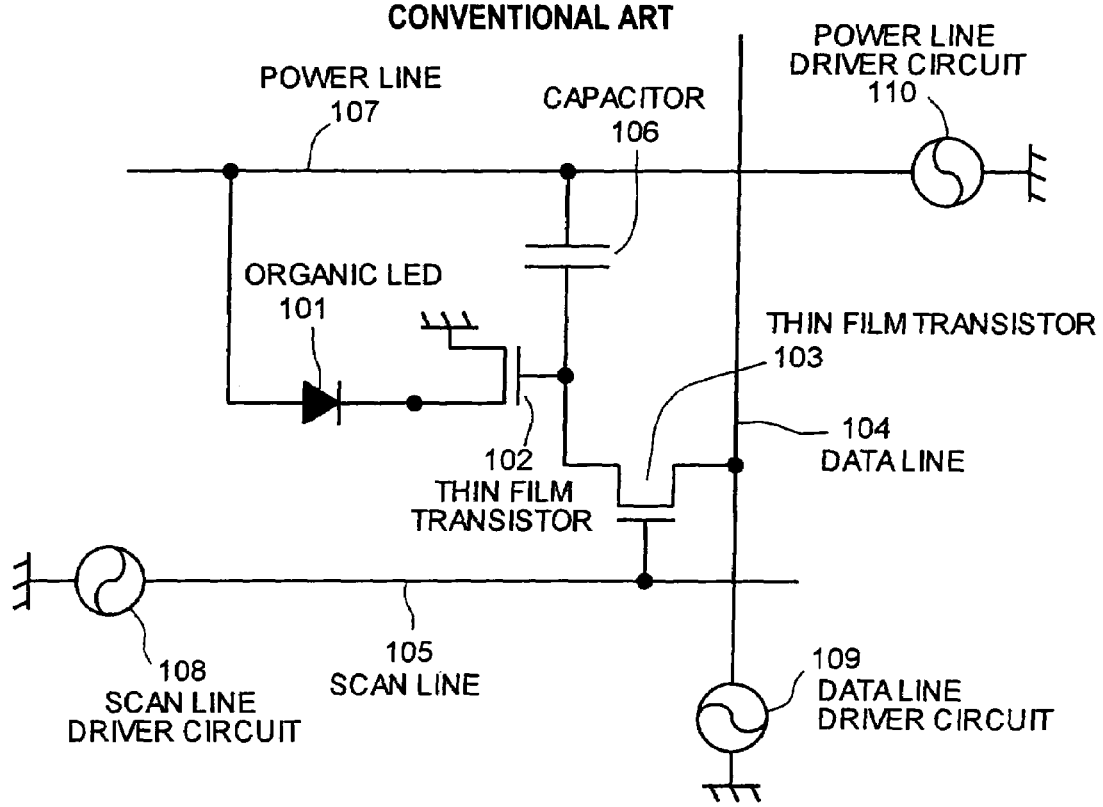
FIG. 8 is an equivalent circuit diagram of a conventional image display apparatus including organic LEDs.

FIG. 7 is a schematic diagram of a modification of the image display apparatus according to the second embodiment. In this modification, light emitting layers 23a to 23d are structured to emit a light with a wavelength corresponding to B, and a color modulator 24 is structured to output lights corresponding to R, G, and B to external.

The color modulator 24 has a function of, based on an incident light with a certain wavelength, outputting a light with a lower energy or a longer wavelength compared to the incident light. Among the lights with wavelengths corresponding to R, G, and B, a light with the highest energy or the shortest wavelength is the light corresponding to B. Accordingly, the structure in which the light emitting layers 23a to 23d emit the light corresponding to B into the color modulator 24 allows the color modulator 24 to output the lights with longer wavelengths corresponding to R and G.

The structure in which the lights with wavelengths corresponding to R, G, and B are extracted from the white light using the color filter blocks light components with other wavelengths in the white color at the color filter. Therefore, it is not preferable from the viewpoint of substantial emission efficiency. In the modification, a certain wavelength component is not extracted from the white light. Rather, the light with the wavelength corresponding to B is converted into lights with longer wavelengths or the lights with wavelengths corresponding to R and G to improve the substantial emission efficiency.

In the modification, the light emitted from the light emitting layers 23a to 23d is assumed as the light with the wavelength corresponding to B but it is not always limited to the light having such wavelength. Specifically, emission of a light with a shorter wavelength than the wavelengths corresponding to R, G, and B, for example, of 400 nanometers or below allows the color modulator 24 to output the lights with wavelengths corresponding to R, G, and B.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. An image display apparatus comprising:
a substrate;

a Red light emitting diode on the substrate;
a Green light emitting diode on the substrate; and
a Blue light emitting diode on the substrate;
wherein each of the Red Green, and Blue light emitting diodes includes
an anode layer;
a cathode layer; and
a multi-stacked layer interposed between the anode and cathode layers and including a plurality of light emitting layers and electron-hole pair generating layers interposed between each of the light emitting layers of each of the Red, Green and Blue light emitting diodes.

2. The image display apparatus according to claim 1, wherein the light emitting layer includes an organic material.

3. The image display apparatus according to claim 1, further comprising:
a driver element that controls a current flowing through the Red, the Green, and the Blue light emitting diode and includes a thin film transistor having a channel layer composed of amorphous silicon.

4. The image display apparatus according to claim 1, wherein the electron-hole pair generating layer comprises a conductive layer having an optical transparency.

5. The image display apparatus according to claim 1, wherein the electron-hole pair generating layer comprises a metal oxide layer having optical transparency.

6. The image display apparatus according to claim 1, wherein the electron-hole pair generating layer comprises ITO (Indium Tin Oxide) layers.

7. The image display apparatus according to claim 1, wherein the electron-hole pair generating layer includes an ITO layer disposed next to the cathode layer of the Red, the Green and the Blue light emitting diode and a cesium-containing conductive layer disposed next to the anode layer of the light emitting diode.

8. The image display apparatus according to claim 1, wherein the light emitting layer emits white light, the image display apparatus further comprises an optical filter to extract a light with a certain wavelength from the white light.

9. The image display apparatus according to claim 1, wherein the light emitting layer emits a light with a wavelength of 400 nanometers or below, the image display apparatus further comprises a color modulating unit that converts the wavelength of the light emitted from the light emitting layer.

10. The image display apparatus according to claim 1, further comprising:
a device isolation layer that isolates the Red, the Green, and the Blue light emitting diode.

11. The image display apparatus according to claim 10, wherein the device isolation layer has a trapezoid shape in a vertical cross section with respect to the substrate, the trapezoid shape tapering from an upper bottom toward a lower bottom.

12. The image display apparatus according to claim 11, wherein the upper bottom of the device isolation layer is higher than an upper surface of the cathode layer.

13. The image display apparatus according to claim 1, further comprising:
a color filter that transmits a light emitted from the Red, the Green, and the Blue light emitting diode.

* * * * *